United States Patent [19]

Blackstone

[11] 4,402,128
[45] Sep. 6, 1983

[54] METHOD OF FORMING CLOSELY SPACED LINES OR CONTACTS IN SEMICONDUCTOR DEVICES

[75] Inventor: Scott C. Blackstone, Hopewell, N.J.

[73] Assignee: RCA Corporation, New York, N.Y.

[21] Appl. No.: 284,728

[22] Filed: Jul. 20, 1981

[51] Int. Cl.³ .................. H01L 21/223; B01J 17/00
[52] U.S. Cl. ................................ 29/591; 29/571; 29/578; 357/59; 156/628
[58] Field of Search .............. 29/578, 577 C, 580, 29/591, 571; 156/628, 654, 656; 148/1.5, 187, 188; 357/59

[56] References Cited

U.S. PATENT DOCUMENTS

| | | | |
|---|---|---|---|
| 3,475,234 | 10/1969 | Kerwin et al. | 148/187 |
| 3,669,655 | 6/1972 | Cox et al. | 75/134 G X |
| 3,738,880 | 6/1963 | Laker | 156/628 |
| 3,798,080 | 3/1974 | Henning et al. | 148/187 |
| 4,057,895 | 11/1977 | Ghezzo | 29/591 |
| 4,124,933 | 11/1978 | Nicholas | 29/578 |
| 4,201,603 | 5/1980 | Scott et al. | 148/174 |
| 4,217,688 | 8/1980 | Ipri | 29/571 |
| 4,225,875 | 9/1980 | Ipri | 357/23 |
| 4,263,057 | 4/1981 | Ipri | 148/15 |
| 4,287,660 | 9/1981 | Nicholas | 29/591 X |

FOREIGN PATENT DOCUMENTS 1477512  2/1977  United Kingdom ............... 29/578

*Primary Examiner*—L. Dewayne Rutledge
*Assistant Examiner*—David A. Hey
*Attorney, Agent, or Firm*—Birgit E. Morris; Donald S. Cohen; Lawrence P. Benjamin

[57] ABSTRACT

A method for forming closely spaced conductors suitable for use, for example, in CCD's and MESFET's is described utilizing an edge diffusion technique to convert exposed edge portions of a polycrystalline silicon layer to a non-etchable form. The converted portions are precisely and accurately formed to serve as spacers, thereby defining a narrow gap between adjacent conductive lines.

10 Claims, 8 Drawing Figures

METHOD OF FORMING CLOSELY SPACED LINES OR CONTACTS IN SEMICONDUCTOR DEVICES

BACKGROUND OF THE INVENTION

This invention relates, in general, to the processing of semiconductor devices and, more particularly, to a novel process for forming closely spaced conductive lines.

As the density of integrated circuit devices formed within a given chip size is increased, the prior art has found that a significant saving in space may be realized by, for example, reducing the size of the areas required for buried contacts. With this reduction in size of the buried contact areas, the space previously occupied by the buried contact may be used for the formation of additional devices. Further, while line widths have also been reduced to the micron and submicron level in an attempt to provide more useful area, it has rapidly reached the point where other means must be utilized to make more area available for the formation of additional devices.

One obvious advantage to having closely spaced lines resides in the Charge Coupled Device (CCD) art wherein the closely spaced lines afford higher transfer efficiencies and higher packing densities. However, there are practical manufacturing limitations as to how closely the lines can be space one from the other. To overcome this difficulty the art resorts to forming a plurality of widely spaced lines, covering the widely spaced lines with a layer of an insulating oxide and thereafter inserting interdigitated lines in the insulated spaces between the first mentioned lines. However, in an arrangement such as this, the interdigitated lines usually overlap the previously formed lines. Thus, it would be advantageous to devise a processing scheme to produce narrow gaps between conductive lines without having to resort to a multilevel interdigitated line technique now used by the prior art.

Another art area that would benefit from close line or electrode spacing is in the self-aligned SOS MESFET art. In these devices, if either of the source or drain diffusion regions were to touch the gate electrode, the gate would be shorted and the Schottky barrier would be lost. However, the greater the separation of the source and drain diffusion regions from the gate member, the higher the channel resistance will be. Thus, with close spacing between the diffusion regions and the gate member, the channel resistance will be optimized. Additionally, with such a fixed minimum geometry, the overall size of the silicon island would be significantly reduced, thereby achieving additional area for additional devices.

SUMMARY OF THE INVENTION

A novel process is described for forming closely spaced conductors wherein the spaces between the conductors are initially formed by an edge diffusion or oxidation.

DETAILED DESCRIPTION OF THE INVENTION

While the following explanation will be presented in terms of forming closely spaced conductive lines formed on a silicon wafer as one operative embodiment, I do not wish to be so limited. Those skilled in the art will readily recognize that while bulk silicon is shown as the body of the substrate, the principles herein espoused apply with equal validity to silicon-on-sapphire (SOS) devices. Further, those skilled in the art will recognize that spinel or monocrystalline aluminum oxide may also be substituted by the sapphire. Additionally, it should be noted that similar elements in the various figures herein presented will be similarly numbered.

Figure 1:
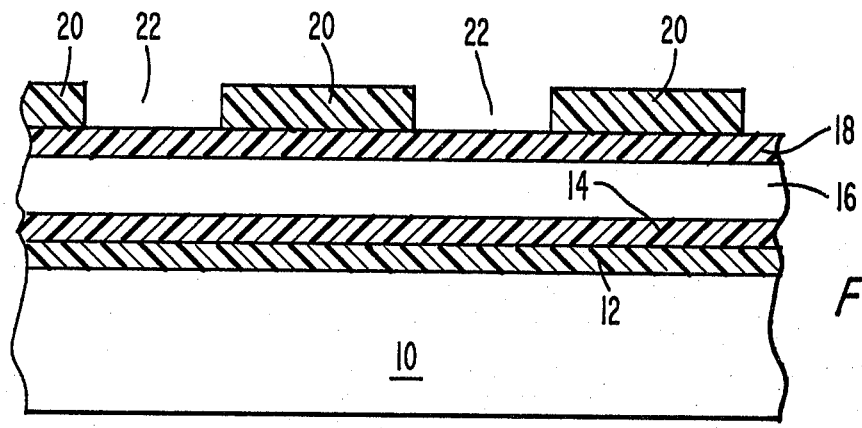
FIGS. 1-5, inclusive, represent sectional views of one embodiment of the subject invention indicating the various stages for forming closely spaced conductive lines suitable for use in a CCD.

Referring now to FIG. 1, there is presented the first step of my novel process for forming closely spaced conductive lines which would have utility, for example, in the CCD art. In this embodiment one commences the novel process by growing a layer of thermal oxide 12 on a monocrystalline silicon wafer 10. Layer 12 is formed to a thickness of about 0.05 $\mu$m (micron) by heating wafer 10 in a dry oxygen ambient in a well known manner. This is followed by the deposition of a silicon nitride layer 14 to a thickness of about 0.05 micron. This nitride deposition step is carried out in the usual silicon nitride chemical vapor deposition (CVD) technique at a temperature which may range between 600°–700° C. As an alternative, one could deposit another 1 micron thick layer of oxide on top of thermal oxide layer 12 in place of nitride layer 14. Thereafter, a layer of polycrystalline silicon (polysilicon) 16 is deposited on nitride layer 14 to a thickness of about 1 micron, for example, by a CVD method. As seen in FIG. 1, masking oxide layer 18 is now deposited on polysilicon layer 16 to a thickness of about 0.2 micron followed by a layer of patterned photoresist 20 in order to start the processing. Patterned photoresist layer 20 is provided with openings 22 which, in the final analysis, provide one dimension of the resultant alternate conductive strips.

Figure 2:
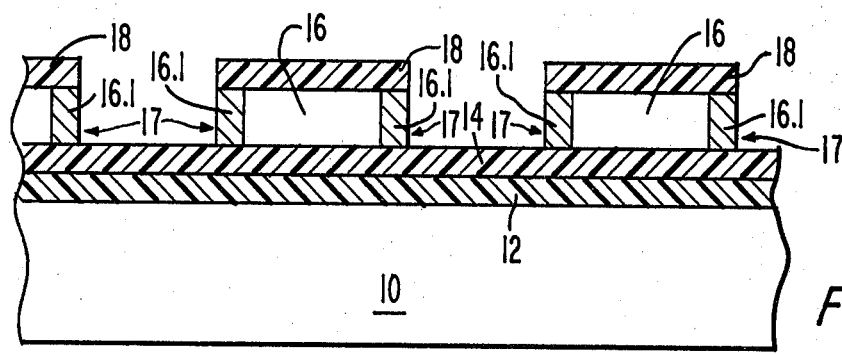

Having formed the device shown in FIG. 1, one then proceeds to use aperture mask 20 as a mask to etch the subsequent layers. Using a buffered HF solution one first etches the exposed portions of masking oxide layer 18. When this is completed, masking oxide layer 18 is used as a mask and, using either a plasma etch or using a KOH solution, polysilicon layer 16 is etched down to layer 14. At this point, layer 20 has been removed. The structure now appears as shown in FIG. 2, and, in one embodiment, is subjected to a P-type dopant, as indicated by arrows 17 and heated. One particular dopant that may be used is boron in the form of diborane. Another embodiment would be to utilize oxygen to oxidize the exposed side walls of polysilicon layer 16 in which event, layer 18 would be silicon nitride about 0.05 micron. As indicated by arrows 17, when using the diborane as a dopant, the doped gas will contact only the exposed edges of polysilicon layer 16 so that the dopant will diffuse laterally into layer 16 from the exposed edges inwardly thereof. This procedure serves to form P-type doped polysilicon lines 16.1 or oxidized lines when oxygen is substituted. Since the diffusion constant of polysilicon layers is well known, the boron diffusion into layer 16 may be accurately controlled by monitoring both the time and the temperature of the diffusion step. Thus, the doped polysilicon strip 16.1, which will subsequently define the gaps between adjacent conductive strips, may be accurately controlled and thus provide very narrow widths. For a more detailed description of this edge diffusion process, attention is directed to U.S. Pat. No. 4,200,878, issued to A. C. Ipri on Apr. 29, 1980 and assigned to the same assignee as the subject application.

Figure 3:
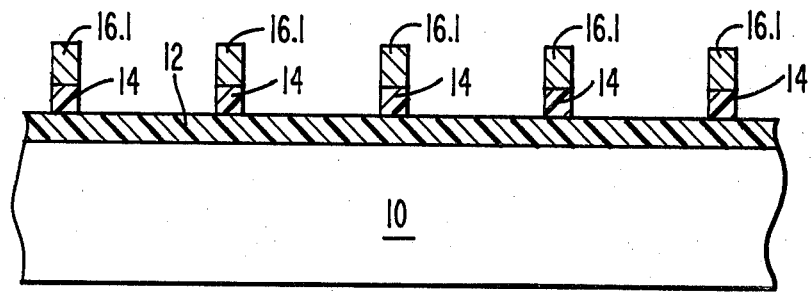

As shown in FIG. 3, doped strips 16.1 appear wherever the exposed edges of polysilicon layer 18 reacted with the boron dopant. Thus, discrete islands have been formed having doped edges. After the boron doping, which lead to the formation of doped lines 16.1, the layer of masking layer 18 is removed by using a buffered HF solution to thus expose the doped (16.1) and the undoped (16) portions of the polysilicon layer. The structure is now subjected to an etching solution consisting of, for example, aqueous hydrazine or to a potassium hydroxide-proponol solution in order to remove the undoped polysilicon and allow the doped polysilicon line 16.1 to remain. This latter process is described in detail in U.S. Pat. No. 3,738,880, issued to A. Laker on June 12, 1963 and also assigned to the same assignee as the subject application.

Referring now to FIG. 3, it will be seen that after the removal of the undoped polysilicon layer 16 the structure is then subjected to a second buffered HF etch to now remove all of the exposed portions of layer 14. If the layer 14 is a layer of silicon nitride, as previously suggested, this may be removed by etching in hot phosphoric acid. However, if a thicker oxide layer has been utilized, suggested as one possible alternative, then a buffered HF may be utilized to remove as much of the underlying oxide layer as desired.

Figure 4:
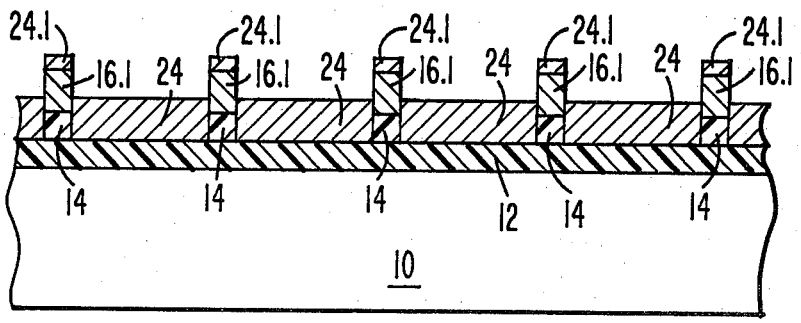

Thereafter, as shown in FIG. 4, the structure is now provided with metallic strips of, for example, aluminum which may be evaporated or formed to a thickness of about 0.2 micron by any one of many well known techniques. For the sake of completeness and accuracy, aluminum caps (24.1) are also deposited on top of doped strips 16.1 and will usually have the same thickness as conductive strips 18.

Figure 5:
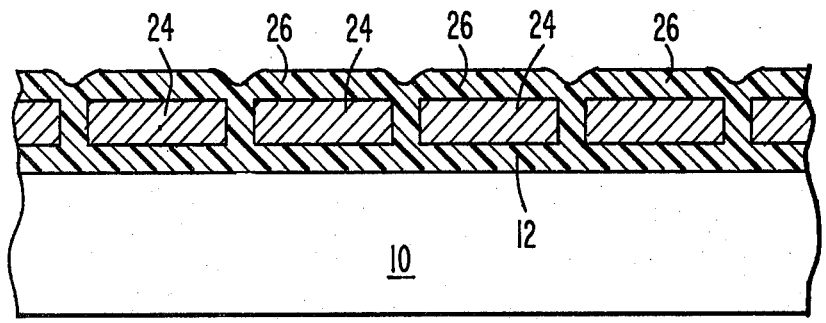

Referring now to FIG. 5, it will be seen that the processing is completed by the removal of doped polysilicon strip 16.1 by subjecting the structure to a P+ polysilicon etching step which, for example, may be a plasma etch, at which time the aluminum caps 24.1 deposited on top of doped strips 16.1 will also fall, and are thus free to be washed away. If desired, the now exposed portions of silicon nitride 14, positioned between conductive strips 24, may be removed using a plasma etch. However, since the silicon nitride is also an insulator, no untoward effects will be noticed if this is allowed to remain. To complete the device, a passivating layer 26 is now deposited over the entire structure and thus there is provided a plurality of closely spaced conductive strips having particular utility in the CCD art.

As an alternate embodiment, one could completely oxidize doped strips 16.1, in which event it would facilitate their removal using a buffered HF etchant instead of the plasma etch.

It should be noted that the rate of lateral oxidation of polysilicon layer 16, in order to form strips 16.1, may be varied by a factor of 2 by doping polysilicon layer 16 with phosphorus. By using phosphorus as the dopant one minimizes penetration of the underlying nitride and oxide layers 14 and 12 during the boron doping. However, it should be noted that boron doping proceeds at a somewhat faster rate.

Figure 6:
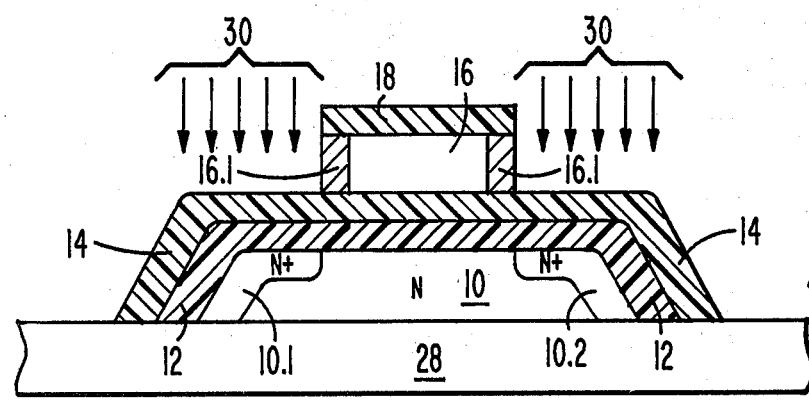
FIGS. 6-8, inclusive, represent sectional views of another embodiment of the subject invention indicating the various stages for forming closely spaced conductive lines suitable for use in a self-aligned MESFET.
Figure 7:
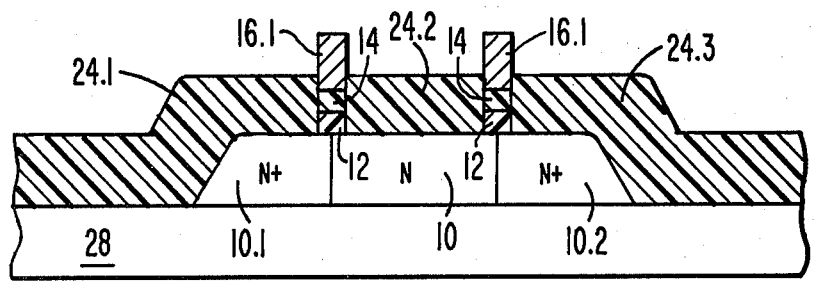
Figure 8:
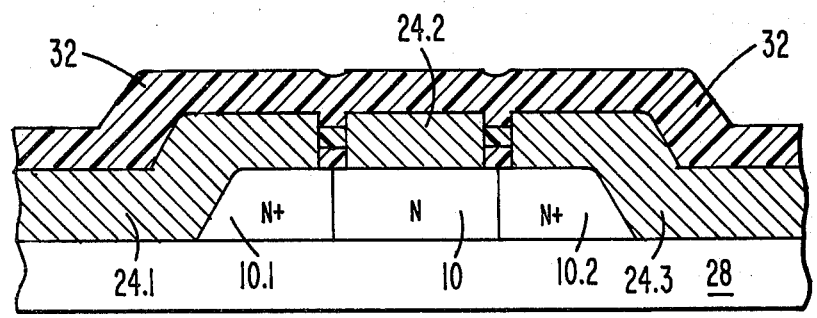

Referring now to FIGS. 6–8, there is shown another embodiment of my novel process adapted to produce, for example, a self-aligned Schottky barrier MESFET. In this latter embodiment, as shown in FIG. 6, one may proceed with forming an island 10 on a sapphire substrate 28 in the well-known manner. Thereafter, island 10 is appropriately doped and provided with a layer of thermal oxide 12, a silicon nitride layer 14, a polysilicon layer 16 and a masking oxide layer 18. As previously described with regard to FIGS. 1 and 2, these layers atop island 10 are etched to form the mesa-like structure of FIG. 2 and then laterally etched. The structure is now subjected to a phosphorus implantation processing as indicated by arrows 30 in FIG. 6. Using phosphorus ions, for example, as the dopant, drain and source regions 10.1 and 10.2 are formed using a dose of about $2 \times 10^{15}$ ions/cm$^2$ at about 100 KeV. This is followed by an annealing or activating step which consists of heating the structure to a temperature ranging from between 900°–1000° C. for about 30 minutes in an inert atmosphere. The resultant dispersion and distribution of the phosphorus atoms in the body of island 10 will produce a distribution as shown in FIG. 7.

Thereafter, the layers 12 and 14 as well as layers 16 and 18 are removed in a manner similar to that shown and described in connection with FIG. 3. This is followed by the deposition of about 0.2 micron of, for example, titanium, molybdenum, or tungsten or any other metal which forms a good Schottky barrier. Traditionally, this is done by evaporation. Thereafter, doped polysilicon strip 16.1 is removed as previously described followed by the deposition of a layer of passivating glass 23 as shown in FIG. 8.

The advantage of the structure formed by this process is that it is totally self-aligned. The source and the drain metal contacts 24.1 and 24.3 are in ohmic contact with the source and drain regions 10.1 and 10.2, respectively, and are thus self-aligned while gate region 24.2 is aligned within channel region 10. By utilizing my process, after implantation and annealing steps, the source/channel and drain/channel junctions are removed from the source and drain contacts to a point under the insulated portion between the metal contacts. However, since the space between the contacts is narrow, there is minimal channel resistance since the gate 24.2 will only have about 0.4 micron separation from the source contact 24.1 and a similar separation from drain contact 24.3. Accordingly, this provides minimum channel resistance for a fixed minimum geometry which is smaller than heretofore available in the prior art.

What I claim is:

1. A method of forming closely spaced conductive lines for a semiconductor device, comprising the steps of:

forming a first layer of insulating material of silicon oxide on a semiconductor body;

forming a silicon nitride barrer layer of insulating material on the first layer of insulating material;

forming a layer of polycrystalline siicon on the barrier layer;

forming an apertured masking layer on the layer of polycrystalline silicon;

etching the polycrystalline silicon layer, through the apertures of the mask down to the silicon nitride barrier layer, to form at least one polycrystalline silicon island having exposed side walls;

coverting the exposed side walls of the islands to selectively unetchable regions with respect to the remainder of the island;

removing the apertured masking layer and etching any unconverted portions of the silicon island to expose portions of the silicon nitride barrier layer, the remaining converted portions defining the spacing between subsequently formed conductive lines;

removing any exposed portions of the silicon nitride barrier layer;

depositing a layer of conductive material on the first insulating layer to fill the space between each of the converted polycrystalline silicon portions and form the conductive lines;

removing the converted portions of polycrystalline silicon and the remainder of the silicon nitride barrier layer thereunder; and depositing a layer of insulating material between the conductive lines and over the conductive lines.

2. The method of claim 1, wherein:
the silicon oxide layer is thermally grown to a thickness of about 0.05 micron to dry oxygen; and
the silicon nitride is deposited by chemical vapor deposition to a thickness of about 0.05 micron.

3. The method of claim 2, wherein the step of forming an apertured masking layer on the polycrystalline silicon comprises the steps of:
depositing a layer of masking oxide to a thickness of about 0.2 micron; and
forming a layer of patterned photoresist, the patterned photoresist layer utilized as a mask to form a similarly patterned mask in the layer of masking oxide.

4. The method of claim 3, wherein the exposed side walls are converted to unetchable regions by subjecting the side walls to a P-type dopant in the form of diborane wherein the converted regions are doped polycrystalline silicon.

5. The method of claim 2, wherein the step of forming an apertured masking layer on the polycrystalline silicon comprises the steps of:
chemically vapor depositing a layer of silicon nitride to a thickness of about 0.05 micron; and
forming a layer of patterned photoresist, on the layer of silicon nitride, the patterned photoresist layer utilized as a mask to form a similarly patterned mask in the layer of silicon nitride.

6. The method of claim 5, wherein the exposed side walls are converted to unetchable regions by subjecting the side walls to wet oxygen wherein the converted regions are oxidized polycrystalline silicon.

7. The method of claim 1, wherein the semiconductor body is provided with a given concentration of conductivity modifiers and is formed on an insulating substrate selected from the group consisting of sapphire, spinel and monocrystalline aluminum oxide.

8. The method of claim 7, wherein prior to depositing the layer of conductive material the following step is performed:
removing the layer of insulating material to expose portions of the semiconductor body.

9. The method of claim 8, wherein prior to the deposition of the layer of conductive materials the following steps are performed:
implanting a higher concentration of the given conductivity modifiers in the body of semiconductor material; and
activating the conductivity modifiers by heating the semiconductor body to a temperature ranging from 900°–1000° C. for a period of about 30 minutes in an inert atmosphere.

10. The method of claim 9, wherein the layer of conductive material deposited on the silicon body is selected from the class of metals consisting of molybdenum, titanium and tungsten.

* * * * *

UNITED STATES PATENT AND TRADEMARK OFFICE
CERTIFICATE OF CORRECTION

PATENT NO. : 4,402,128

DATED : September 6, 1983

INVENTOR(S) : Scott Carlton Blackstone

It is certified that error appears in the above-identified patent and that said Letters Patent is hereby corrected as shown below:

Column 1, line 29, "space" should be --spaced--.

Column 4, line 59, "barrer" should be --barrier--.

Column 5, line 25, "to" should be --in--.

Signed and Sealed this

Twenty-ninth Day of November 1983

[SEAL]

Attest:

GERALD J. MOSSINGHOFF

Attesting Officer

Commissioner of Patents and Trademarks